United States Patent
Watanabe

(10) Patent No.: US 10,333,467 B2
(45) Date of Patent: Jun. 25, 2019

(54) CRYSTAL OSCILLATOR

(71) Applicant: NIHON DEMPA KOGYO CO., LTD., Tokyo (JP)

(72) Inventor: Yoshihiro Watanabe, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 199 days.

(21) Appl. No.: 15/409,538

(22) Filed: Jan. 19, 2017

(65) Prior Publication Data

US 2017/0214364 A1 Jul. 27, 2017

(30) Foreign Application Priority Data

Jan. 25, 2016 (JP) ................. 2016-011206

(51) Int. Cl.
*H03B 5/32* (2006.01)
*H03H 9/10* (2006.01)
*H03L 1/00* (2006.01)
*H03L 7/00* (2006.01)

(52) U.S. Cl.
CPC ................ *H03B 5/32* (2013.01); *H03H 9/10* (2013.01); *H03L 1/00* (2013.01); *H03L 7/00* (2013.01)

(58) Field of Classification Search
CPC .... H03L 7/00; H03L 1/00; H03B 5/32; H03H 9/10
USPC ......... 331/158, 116 FE, 108 C, 66; 310/353, 310/348; 438/112
See application file for complete search history.

(56) References Cited

U.S. PATENT DOCUMENTS

| | | | | |
|---|---|---|---|---|
| 6,147,565 A | * | 11/2000 | Satoh ....................... | H03B 5/32 219/210 |
| 6,967,537 B2 | * | 11/2005 | Harima ..................... | H03B 5/32 310/348 |
| 7,760,034 B2 | * | 7/2010 | Moriya ................ | H03H 9/1021 331/108 D |
| 2006/0055479 A1 | * | 3/2006 | Okazaki ................... | H03B 5/32 331/158 |
| 2015/0015341 A1 | * | 1/2015 | Kojo ........................ | H03B 5/32 331/158 |

FOREIGN PATENT DOCUMENTS

JP 2000-353919 12/2000

* cited by examiner

*Primary Examiner* — Arnold M Kinkead
(74) *Attorney, Agent, or Firm* — JCIPRNET

(57) ABSTRACT

A crystal oscillator includes a surface mount type crystal unit and a mounting substrate. The surface mount type crystal unit includes a ceramic container. The surface mount type crystal unit has a rectangular shape as a planar shape. The mounting substrate includes a ceramic substrate on which an electronic component is mounted, the mounting substrate having a rectangular shape as a planar shape. The crystal oscillator has a structure where the surface mount type crystal unit and the mounting substrate are laminated, and both terminals of the surface mount type crystal unit and the mounting substrate are connected with a bonding material. The mounting substrate and the surface mount type crystal unit are connected in a positional relationship where a long side of the mounting substrate and a long side of the surface mount type crystal unit are orthogonal.

4 Claims, 5 Drawing Sheets

CRYSTAL OSCILLATOR

CROSS-REFERENCE TO RELATED APPLICATIONS

This application is based on and claims priority under 35 U.S.C. § 119 to Japanese Patent Application No. 2016-011206, filed on Jan. 25, 2016, the entire content of which is incorporated herein by reference.

TECHNICAL FIELD

This disclosure relates to a surface mount type crystal oscillator having a structure where a mounting substrate on which electronic components are mounted and a surface mount type crystal unit are laminated.

DESCRIPTION OF THE RELATED ART

A crystal oscillator is a frequency reference source required for information-driven society. For example, there is known a surface mount type crystal oscillator (hereinafter referred to as a laminated type crystal oscillator) described in Japanese Unexamined Patent Application Publication No. 2000-353919, specifically see FIG. 1 and claim 2, as one type of such crystal oscillator. The surface mount type crystal oscillator has a structure where a mounting substrate and a surface mount type crystal unit are laminated. The mounting substrate is constituted of a ceramic substrate on which electronic components (an IC and capacitors) are mounted. The surface mount type crystal unit employs a ceramic container.

This laminated type crystal oscillator includes terminal electrodes disposed in the crystal unit and terminal connection electrodes disposed on the mounting substrate, which are connected by soldering, thus achieving the object structure. Then, the mounting substrate includes mounting electrodes disposed on a surface opposite to the crystal unit side. The mounting electrodes are connected to electronic equipment to incorporate this laminated type crystal oscillator in the electronic equipment. This laminated type crystal oscillator achieves a desired oscillator simply by laminating a versatile crystal unit on a desired mounting substrate. This brings advantages, for example, productivity.

Now, there is known a temperature compensation type crystal oscillator as one type of crystal oscillators. While the temperature compensation type crystal oscillator performs temperature compensation to have output frequency with an accuracy higher than a crystal oscillator other than the temperature compensation type, this temperature compensation type crystal oscillator needs to meet a specification item called hysteresis characteristics. FIG. 5 is a drawing describing the hysteresis characteristics. The horizontal axis indicates an environmental temperature in an environment where the crystal oscillator is placed, and the vertical axis indicates a rate of change of output frequency of the crystal oscillator. FIG. 5 indicates that the difference between frequency change characteristics T1 and T2 is generated (generation of the hysteresis characteristics) when the environmental temperature was raised and dropped. It is ideal that there is no hysteresis characteristic. In practice, it is desirable that the maximum value ΔFmax among differences ΔFn between rates of change of frequency when the environmental temperature was raised and dropped is less than or equal to a predetermined value. It is desirable that the hysteresis characteristic of a laminated type and temperature compensation type crystal oscillator is also improved.

One of causes that degrade the hysteresis characteristics of the laminated type crystal oscillator is stress generated in a crystal element. The stress is caused by the difference of thermal expansion coefficients between the mounting substrate and the crystal unit. If this stress can be reduced, improvement of the above-described hysteresis characteristics can be expected.

A need thus exists for a crystal oscillator which is not susceptible to the drawback mentioned above.

SUMMARY

According to an aspect of this disclosure, there is provided a crystal oscillator that includes a surface mount type crystal unit and a mounting substrate. The surface mount type crystal unit includes a ceramic container. The surface mount type crystal unit has a rectangular planar shape. The mounting substrate includes a ceramic substrate on which an electronic component is mounted, the mounting substrate having a rectangular planar shape. The crystal oscillator has a structure where the surface mount type crystal unit and the mounting substrate are laminated, and both terminals of the surface mount type crystal unit and the mounting substrate are connected with a bonding material. The mounting substrate and the surface mount type crystal unit are connected in a positional relationship where a long side of the mounting substrate and a long side of the surface mount type crystal unit are orthogonal.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

Figure 1A:
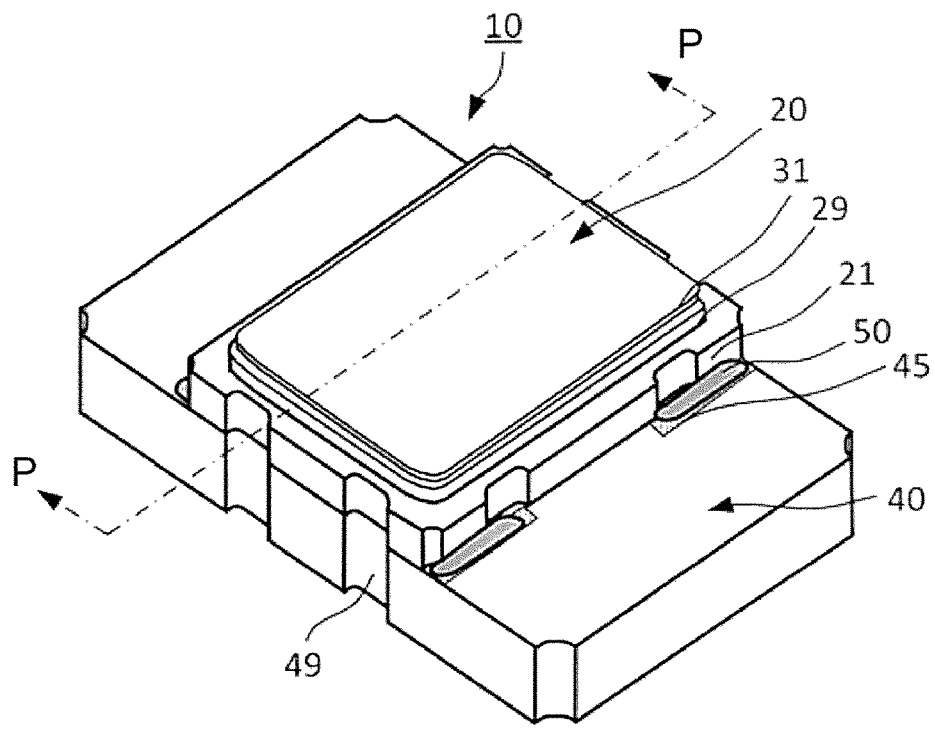
FIG. 1A and FIG. 1B are explanatory drawings illustrating a crystal oscillator 10 according to an embodiment.

The following describes an embodiment of a crystal oscillator according to this disclosure with reference to the drawings. Each drawing used in the description is merely illustrated schematically for understanding this disclosure. In each drawing used in the description, like reference numerals designate corresponding or identical elements, and therefore such elements may not be further elaborated here. Shapes, dimensions, materials, and a similar factor described in the following embodiment are merely preferable examples within the scope of this disclosure. Therefore, this disclosure is not limited to only the following embodiment.

1. Explanation of Structure

Figure 1B:
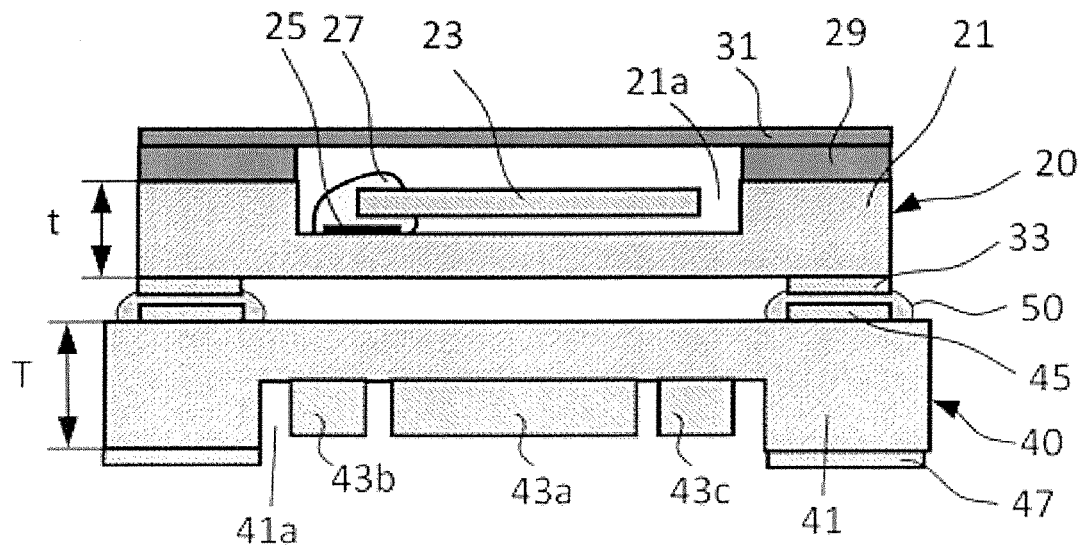

FIG. 1A and FIG. 1B are explanatory drawings illustrating a crystal oscillator 10 according to the embodiment. Especially, FIG. 1A is a perspective view of the crystal oscillator 10 according to the embodiment. FIG. 1B is a sectional drawing of the crystal oscillator 10 according to the embodiment and a sectional drawing taken along the line P-P in FIG. 1A.

The crystal oscillator 10 according to the embodiment includes a surface mount type crystal unit 20, a mounting substrate 40, and bonding materials 50. The bonding materials 50 connect mounting terminals 33 and 45 disposed on opposing surfaces of the crystal unit 20 and the mounting substrate 40 to one another. Solder is employed as bonding material.

The crystal unit 20 includes a ceramic container 21 having a depressed portion 21a. Then, in this depressed portion 21a, a crystal element 23 is mounted (FIG. 1B). In detail, the crystal element 23 is secured to conductive bumps 25 disposed on the bottom surface of the depressed portion 21a in the ceramic container 21 by conductive adhesives 27. The crystal unit 20 includes a seam welding ring 29 disposed on the top surface of the ceramic container 21, and a lid member 31 is welded to this seam welding ring 29. Further, this ceramic container 21 has a surface opposed to the mounting substrate 40. On respective four corners of the surface, four mounting terminals 33 in total are disposed one by one. In the case of this working example, the two mounting terminals 33 among these four mounting terminals 33 are connected to the conductive bumps 25 via a via wiring (not illustrated) formed in the ceramic container 21.

Figure 2A:
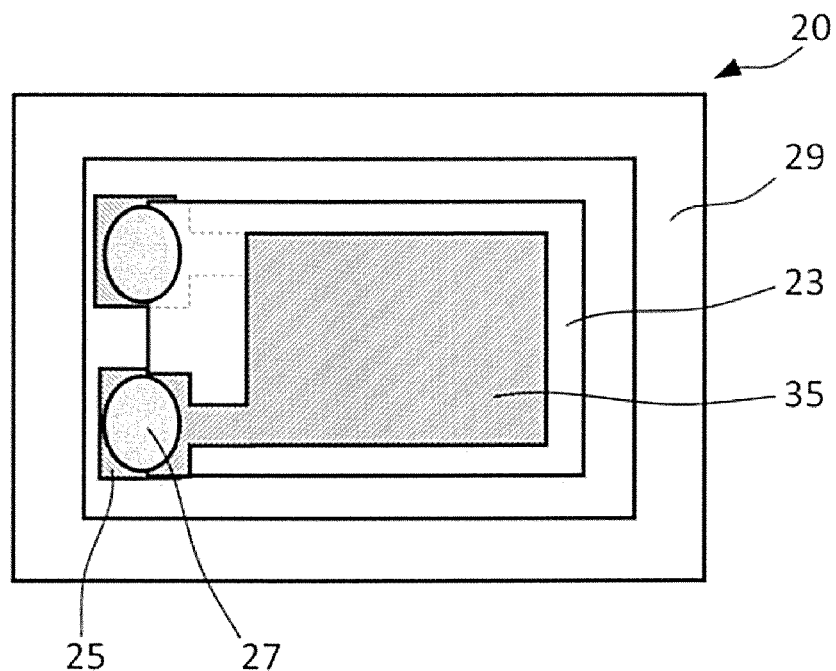
FIG. 2A and FIG. 2B are explanatory drawings mainly illustrating a crystal unit 20 included in the crystal oscillator 10 according to the embodiment.
Figure 2B:
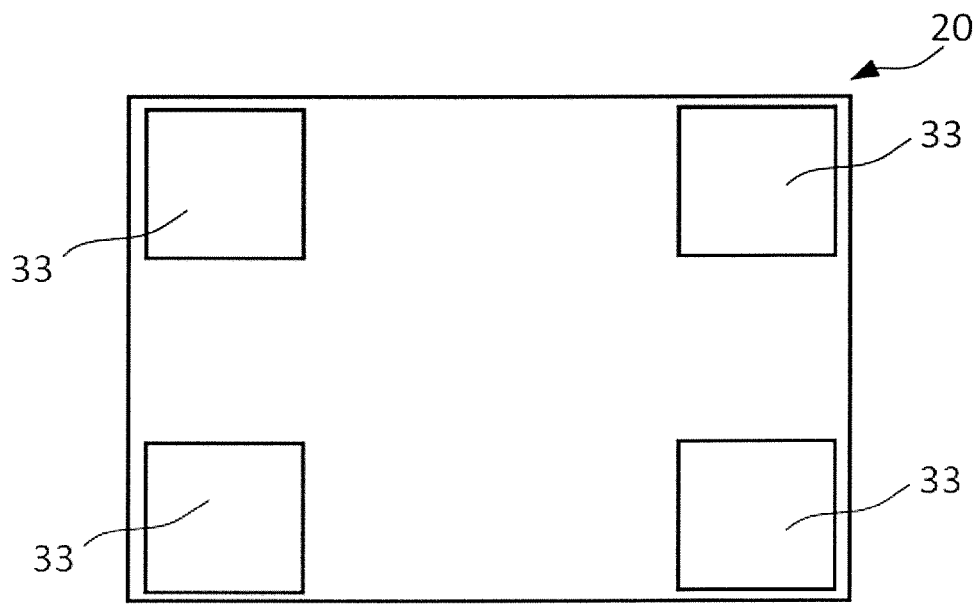

FIG. 2A is a top view of the crystal unit 20 without the lid member 31 of the crystal unit 20. FIG. 2B is a bottom view of the crystal unit 20. In this case, the crystal element 23 built in the crystal unit 20 is an AT-cut crystal element having a rectangular planar shape. On both principal surfaces of this crystal element 23, excitation electrodes 35 are disposed. This crystal element 23 is connected and secured to the conductive bumps 25 at two points apart along a short side direction of an end portion in its short side by the conductive adhesives 27. As described above, the diagonally disposed two among the four mounting terminals 33 disposed on the bottom surface of the crystal unit 20 are connected to the excitation electrodes 35 via the via wiring (not illustrated) and the conductive bumps 25. Then, these four mounting terminals 33 are connected to the mounting terminals 45 on the mounting substrate 40 side via the bonding material 50.

As illustrated in FIG. 1B, the mounting substrate 40 includes a ceramic substrate 41, as a frame material, having a depressed portion 41a. This depressed portion 41a is disposed on a surface opposite side of the crystal unit 20 in the ceramic substrate 41. Then, on the bottom surface of this depressed portion 41a, electronic components which are specifically, an oscillator circuit, an integrated circuit (IC) 43a for a temperature compensation circuit, and capacitors 43b and 43c, are disposed. On this ceramic substrate 41, the mounting terminals 45 are disposed at the positions corresponding to the mounting terminals 33 of the crystal unit 20. Then, in the case of this example, the bonding materials 50 connect and secure the crystal unit 20 to the mounting substrate 40 at the positions of the respective mounting terminals 33 and 45 disposed in the crystal unit 20 and the mounting substrate 40, that is, at the four positions. Mounting terminals 47 are disposed on edge regions on the surface on which the depressed portion 41a in the ceramic substrate 41 are disposed. The mounting terminals 47 mount this crystal oscillator 10 to electronic equipment or similar equipment. The electronic components 43a, 43b, and 43c, the mounting terminals 45, and the mounting terminals 47 are connected to one another in a predetermined relation via, for example, the via wiring (not illustrated) and castellations 49. The mounting terminals 47 are used as various kinds of terminals such as a power source terminal, a GND terminal, and an output terminal.

In the case of the embodiment, the size of the mounting substrate 40 is the size referred to as type 5032, and the size of the crystal unit 20 is the size referred to as type 3225. Thus, the length of a long side of the mounting substrate 40 is identical or approximately identical to the length of a short side of the crystal unit 20, and both the lengths are about 3.2 mm. The laminated type crystal oscillator 10 according to the embodiment is achieved as follows: the crystal unit 20 and the mounting substrate 40 are separately prepared; both are laminated after solder cream is applied over the mounting terminals on one of the crystal unit 20 and the mounting substrate 40; and processed in, for example, a tunnel kiln.

2. Explanation of Simulations and their Results

Figure 3:
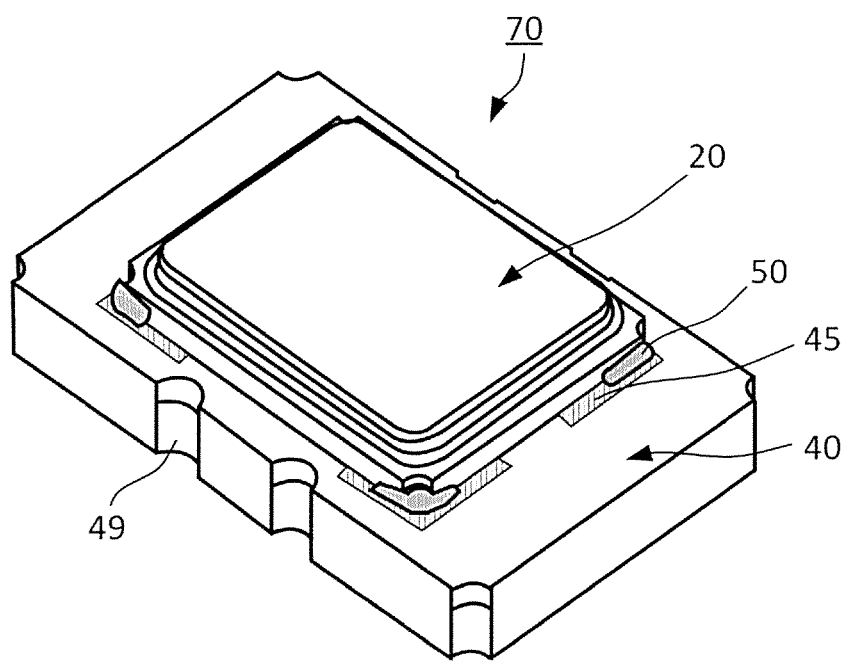
FIG. 3 is an explanatory drawing illustrating a crystal oscillator 70 according to a comparative example.

The following describes results of performing simulations based on a finite element method by use of the following finite element method models. The finite element method models include: a finite element method model (hereinafter referred to as a working example) of the laminated type crystal oscillator according to the above-described disclosure; and a finite element method model (hereinafter referred to as a comparative example) similar to the disclosure except that a long side of the crystal unit 20 is parallel to the long side of the mounting substrate 40 as illustrated in FIG. 3.

Conditions of the simulations are as follows. The mounting substrate 40 has a long side dimension of about 5 mm and a short side dimension of about 3.2 mm (what is called type 5032). A thick portion in the mounting substrate 40 has a thickness T (see FIG. 1B) of about 0.8 mm. The crystal unit 20 has a long side dimension of about 3.2 mm and a short side dimension of about 2.5 mm (what is called type 3225). A thick portion in the ceramic portion has a thickness t (see FIG. 1B) of about 0.3 mm. The seam welding ring 29 has a thickness of about 0.12 mm. The nominal frequency of the crystal element 23 is 19.2 MHz. The bonding material 50 is a solder. Then, a stress simulation when temperatures of the models of the working example and the comparative example were changed was performed by use of the finite element method. Temperature change conditions include two conditions: the case where a temperature is changed from a room temperature (25° C. in this simulation) to +125° C.; and the case where a temperature is changed from the room temperature to −125° C. In the working example and the comparative example, the simulation conditions are identical except for the positional relationship where the mounting substrate and the crystal unit being orthogonal. Thus the explanation of detailed dimensions and physical properties of respective portions of the employed models are not elaborated.

Figure 4A:
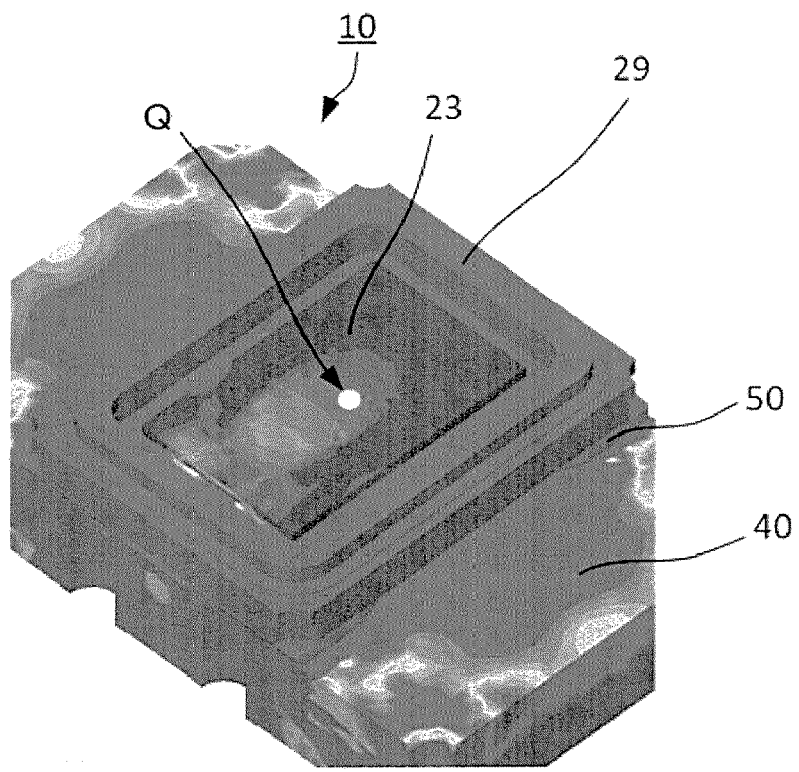
FIG. 4A and FIG. 4 B are supplementary drawings describing simulation results.
Figure 4B:
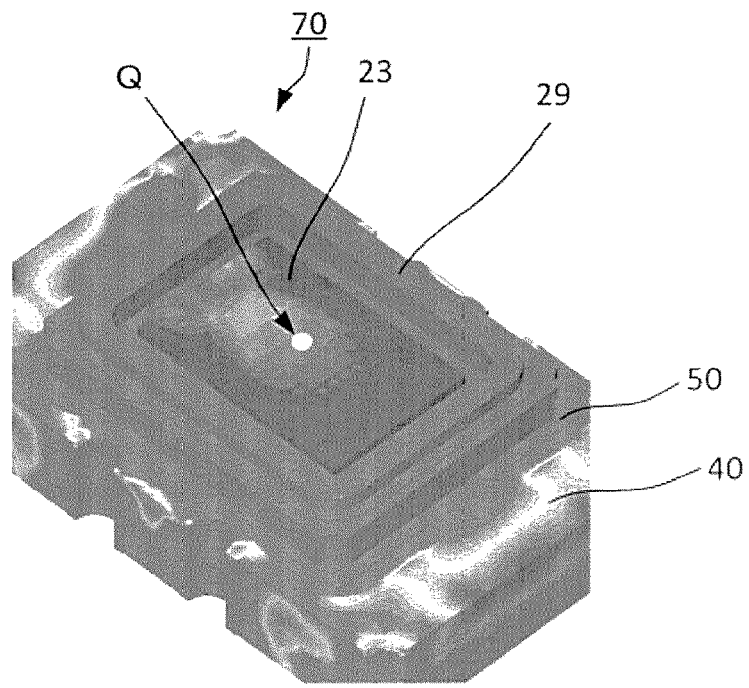
Figure 5:
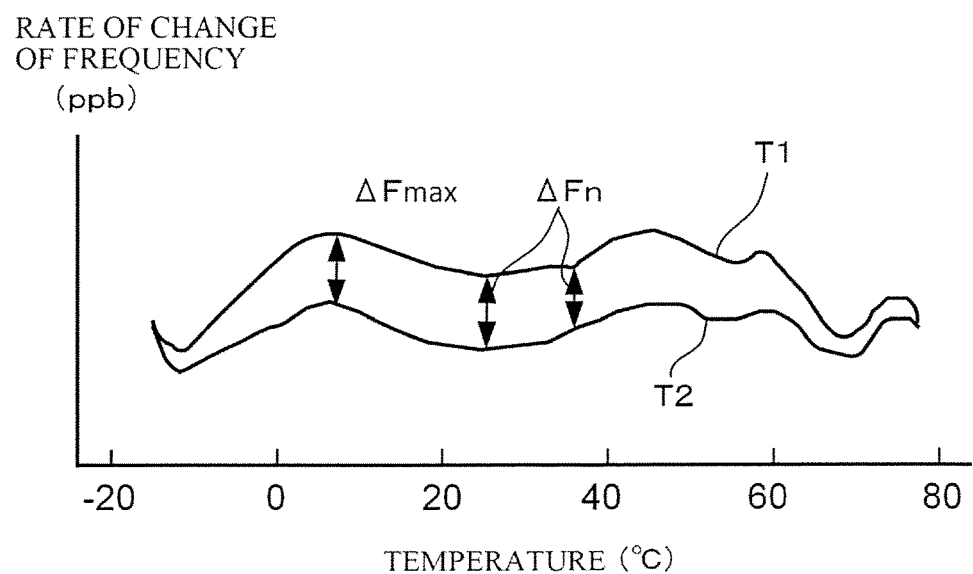
FIG. 5 is a drawing describing hysteresis of frequency/temperature characteristics.

FIG. 4A and FIG. 4B are drawings illustrating images during the simulation cited for understanding stress distribution simulations of the models in which the above-described temperature changes were performed. The reference numerals of the respective members and similar numeral in these FIG. 4A and FIG. 4B are indicated with the reference numerals identical to, for example, FIG. 1A and FIG. 1B. In FIG. 4A and FIG. 4B, "Q" means a center portion of the crystal element 23. In this simulation, the effect of the working example was examined by calculating the stress at the Q point when the above-described temperature change was provided. The stress at the Q point is calculated at two points, at a front side and a back side (the mounting substrate side) of the crystal element. These results are indicated in Table 1 and Table 2. Table 1 indicates the maximum value of the stress generated at each of the center portions Q on the front side and the back side of the crystal element 23 when the temperatures of the respective models of the working example and the comparative example were changed from the room temperature to +125° C. Table 2 indicates the maximum value of the stress generated at each of the center portions Q on the front side and the back side of the crystal element 23 when the temperatures of the respective models of the working example and the comparative example were changed from the room temperature to −125° C.

TABLE 1

Maximum stress generated in sample when temperature of model is changed from room temperature to +125° C.

|  | Working Example | Comparative Example |
|---|---|---|
| Stress Generated at Center Portion on Front Side of Crystal Element | 0.562 | 0.581 |
| Stress Generated at Center Portion on Back Side of Crystal Element | 0.252 | 0.394 |

Unit: MPa

TABLE 2

Maximum stress generated in sample when temperature of model is changed from room temperature to −125° C.

|  | Working Example | Comparative Example |
|---|---|---|
| Stress Generated at Center Portion on Front Side of Crystal Element | 0.866 | 0.829 |
| Stress Generated at Center Portion on Back Side of Crystal Element | 0.378 | 0.536 |

Unit: MPa

The simulation results indicated in Table 1 and Table 2 suggest that the stress generated at the center portion on the back surface side (the mounting substrate side) of the crystal element in the working example was small compared with that of the comparative example in both the cases where the temperature of the model was raised or dropped from the room temperature. Specifically, on the back surface of the crystal element, when the temperature was raised, the ratio of the stresses as the working example/the comparative example=0.252/0.394≈64%. When the temperature was dropped, the ratio of the stresses as the working example/the comparative example=0.378/0.536≈71%. On the other hand, on the front side of the crystal element, when the temperature was raised, the ratio of the stresses as the working example/the comparative example=0.562/0.581≈97%. When the temperature was dropped, the ratio of the stresses as the working example/the comparative example=0.866/0.829≈104%. These suggest that the stresses of the working example and the comparative example were similar. The stresses generated on the front side of the crystal element of the working example and the comparative example seem to be approximately similar, and there is no difference. Probably, this is because the distortion caused by, for example, the difference in coefficients of thermal expansion between the mounting substrate and the crystal unit affects the back side (the mounting substrate side) portion of the crystal element first, and the effect is gradually reduced toward the front side of the crystal element. Even though the stress on the front side of the crystal element appears to be identical between the working example and the comparative example, this simulation indicates that the working example is advantageous to reduce the stress generated on the crystal element. From this, in the case where the mounting substrate having a rectangular a planar shape and the surface mount type crystal unit having a rectangular a planar shape are laminated to constitute the laminated type crystal oscillator, it is found that laminating by orthogonally disposing the long side of the mounting substrate to the long side of the crystal unit is preferable. With this configuration, the reduced hysteresis of the temperature characteristic can also be expected.

3. Other Embodiments

While the working example of the crystal oscillator according to this disclosure is described above, this disclosure is not limited to the above-described embodiment. For example, in the above-described example, while the size of the mounting substrate is, what is called, type 5032, and the size of the crystal unit is, what is called, type 3225, the effects of this disclosure are obtained even from a combination of the mounting substrate and the crystal unit having sizes different from the working example. While this disclosure is preferably applied to the laminated type crystal oscillator with the temperature compensation type for strict specifications of the frequency/temperature characteristics, this disclosure is also applicable to a laminated type crystal oscillator other than the temperature compensation type. While in the above-described working example, the crystal unit with the seam welding ring is employed as the crystal unit, this disclosure is applicable even to another crystal unit, such as a crystal unit without a seam welding ring, what is called, a direct seam type. While in the above-described working example, the AT-cut crystal element in the rectangular planar shape is employed as the crystal element, this disclosure is applicable even to a crystal element with a different shape and cutting angle such as an SC cut and an IT cut.

Here, the long side of the mounting substrate 40 and the long side of the surface mount type crystal unit 20 are orthogonal in a way by forming an angle of 90 degrees±5 degrees, preferably the range of ±3 degrees.

In this disclosure, the above-described bonding material is typically a solder. Specifically, the bonding material is lead solder including lead and tin as main components, lead-free solder (for example, tin lead-free solder including components chosen from tin, argentum, copper, zinc, and similar metal), or gold solder such as gold-tin alloy solder. In some cases, the bonding material may be a conductive adhesive material.

The mounting substrate according to this disclosure is the mounting substrate where at least an electronic component for a crystal oscillation circuit is mounted. Further, this mounting substrate is the mounting substrate with an outer shape larger than an outer shape of the laminated crystal unit. It is more preferable that the substrate has a size larger than the outer shape of the employed crystal unit in a standardized size group of a crystal unit. For example, in the case where the length of the long side of the crystal unit is about 3.2 mm and the length of the short side of the crystal unit is about 2.5 mm (what is called type 3225), it is preferable that the mounting substrate has the following size. The length of the long side of the mounting substrate is about 5.0 mm, and the length of the short side of the mounting substrate is about 3.2 mm (what is called type 5032). That is, it is preferred to have a relationship where the length of the short side of the mounting substrate and the length of the long side of the crystal unit are identical or approximately identical. Specifically, it is preferred to have a relationship where the length of the short side of the crystal unit is 95% to 105% of the length of the short side of the mounting substrate, preferably 98% to 102%, more preferably 99% to 101%.

In the case where the crystal unit and the mounting substrate have the above-described size relationship, there are advantages as follows. For example, the stress generated in the crystal element is easily reduced, further, the crystal unit is easily mounted on the mounting substrate, and even when this crystal oscillator is mounted on the substrate of the electronic equipment, a land pattern and similar pattern are easily standardized. Therefore, additionally, there are advantages as follows. For example, the laminated type crystal oscillator using the complete crystal unit is provided at low price, with high yield, and moreover in a user-friendly configuration. Other combination examples include, for example, the crystal unit having the long side of about 2.5 mm and the short side of about 2.0 mm (what is called 2520 type), and the mounting substrate having the long side of about 3.2 mm and the short side of about 2.5 mm (what is called type 3225).

While in a conventional laminated type crystal oscillator, the mounting substrate and the surface mount type crystal unit are laminated such that both long sides are parallel to one another (see FIG. 3), the mounting substrate and the surface mount type crystal unit are laminated such that both the long sides are orthogonal to one another in this disclosure. Thus, as apparent from the above-described simulation results, the stress generated in the crystal element in the crystal unit caused by the environmental temperature change of this crystal oscillator is reduced compared with the conventional manner. Accordingly, the improvement of the hysteresis characteristics of the frequency/temperature characteristics can be expected.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A crystal oscillator, comprising:
   a surface mount type crystal unit that includes a ceramic container, the surface mount type crystal unit having a rectangular planar shape; and
   a mounting substrate that includes a ceramic substrate on which an electronic component is mounted, the mounting substrate having a rectangular planar shape, wherein
   the crystal oscillator has a structure where the surface mount type crystal unit and the mounting substrate are laminated, and both terminals of the surface mount type crystal unit and the mounting substrate are connected with a bonding material, and
   the mounting substrate and the surface mount type crystal unit are connected in a positional relationship where a long side of the mounting substrate and a long side of the surface mount type crystal unit are orthogonal;
   wherein a length of a short side of the mounting substrate and a length of the long side of the surface mount type crystal unit are identical or approximately identical.

2. The crystal oscillator according to claim 1, wherein the long side of the mounting substrate and the long side of the surface mount type crystal unit are orthogonal in a way by forming an angle of 90 degrees±5 degrees.

3. The crystal oscillator according to claim 1, wherein the long side of the mounting substrate and the long side of the surface mount type crystal unit are orthogonal in a way by forming an angle of 90 degrees±3 degrees.

4. The crystal oscillator according to claim 1, wherein the mounting substrate is a substrate having a size larger than an outer shape of the surface mount type crystal unit employed for laminating on the mounting substrate in a standardized size group of the surface mount type crystal unit.

* * * * *